United States Patent [19]

Inami et al.

[11] Patent Number: 5,812,030
[45] Date of Patent: Sep. 22, 1998

[54] AMPLIFIER DEVICE CAPABLE OF CARRYING OUT A STABLE AMPLIFYING OPERATION WITHOUT A GAIN VARIATION

[75] Inventors: Daijiro Inami, Tokyo; Yasuhiro Otsuka, Miyagi, both of Japan

[73] Assignee: NEC Corporation, Tokyo, Japan

[21] Appl. No.: 666,199

[22] Filed: Jun. 20, 1996

[30] Foreign Application Priority Data

Jun. 20, 1995 [JP] Japan ................................. 7-153150

[51] Int. Cl.$^6$ .............................. H03F 3/08; H04B 10/06
[52] U.S. Cl. .................... 330/308; 330/282; 250/214 A; 250/214 AG; 359/194
[58] Field of Search ..................... 250/214 A, 214 AG; 330/59, 86, 282, 308; 359/189, 194

[56] References Cited

U.S. PATENT DOCUMENTS 3,408,579 10/1968 Smith ........................... 250/214 AG X
4,429,967 2/1984 Tokuda et al. ................ 250/214 AG X
4,459,475 7/1984 Flint et al. ........................ 250/214 AG
4,574,249 3/1986 Williams .................................. 330/59
4,718,119 1/1988 Salzer et al. ............................ 359/194

FOREIGN PATENT DOCUMENTS 239124 10/1986 Japan .............................. 250/214 AG
63-151205 6/1988 Japan .

Primary Examiner—James B. Mullins
Attorney, Agent, or Firm—Sughrue, Mion, Zinn, Macpeak & Seas, PLLC

[57] ABSTRACT

An amplifier section is supplied with an electric signal outputted from a light-sensitive detector. The amplifier section comprises an amplifying circuit for amplifying the electric signal into an amplified signal having an amplified level. A producing section produces a control signal on the basis of the amplified signal and a reference voltage. A resistor section is connected to the amplifying circuit in parallel. The resistor section has a variable resistance which is varied in accordance with the control signal. A capacitor section has a capacitor and connects the input of the amplifying circuit and the output of the amplifying circuit through the capacitor in response to the control signal.

10 Claims, 8 Drawing Sheets

AMPLIFIER DEVICE CAPABLE OF CARRYING OUT A STABLE AMPLIFYING OPERATION WITHOUT A GAIN VARIATION

BACKGROUND OF THE INVENTION

This invention relates to an amplifier device for amplifying an electric signal outputted from a light-sensitive detector and, more particularly, to an amplifier device using a transimpedance amplification to control an electric signal outputted from a light-sensitive detector.

In general, it is known that an amplifier device uses a transimpedance amplification to amplify an electric signal outputted from a light-sensitive detector. Such an amplifier device amplifies the electric signal into an amplified signal having an amplified level.

A conventional amplifier device is disclosed in Japanese Patent Publication Tokkai Sho 63-151205 (151205/1988). The conventional amplifier device comprises an amplifier circuit of a transimpedance type, a comparator circuit, a distributing circuit, and an automatic gain control circuit (AGC circuit). The amplifier circuit amplifies an electric signal outputted from an avalanche photodiode to produce an amplified signal having an amplified voltage level. The AGC circuit controls the avalanche photodiode in accordance with the amplified voltage level. The amplified voltage level of the amplified signal is compared with a threshold or reference voltage level by the comparator circuit in order to obtain a comparison result. The distributing circuit controls to supply an electric signal to the amplifier circuit on the basis of the comparison result.

In the conventional amplifier device, however, it is difficult to carry out a stable amplifying operation without a gain variation as will later be described.

SUMMARY OF THE INVENTION

It is therefore an object of this invention to provide an amplifier device capable of carrying out a stable amplifying operation without a gain variation.

Other objects of this invention will become clear as the description proceeds.

According to this invention, there is provided an amplifier device comprising a light-sensitive detector for detecting a light signal to produce an electric signal in accordance with the light signal and an amplifier section for amplifying the electric signal into an amplified signal having an amplified level. The amplifier section comprises amplifying means having a variable gain which is varied in accordance with a control signal. The amplifying means amplifies the electric signal into the amplified signal in accordance with the control signal. The amplifier section further comprises producing means for producing the control signal on the basis of the amplified signal and a first reference level.

DESCRIPTION OF THE PREFERRED EMBODIMENT

Figure 1:
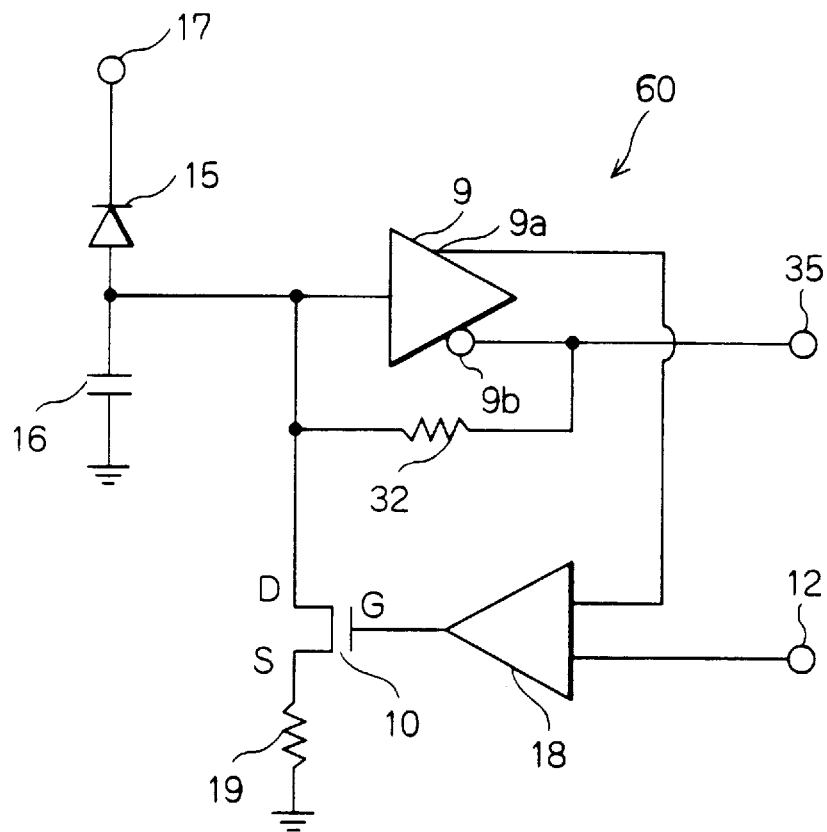
FIG. 1 is a block diagram of a conventional amplifier device.

Referring to FIG. 1, a conventional amplifier device 60 will be described at first in order to facilitate an understanding of this invention. The illustrated amplifier device 60 comprises a photodiode 15 having a cathode connected to an electric power terminal 17. The anode of the photodiode 15 is connected to the virtual ground. In general, a parasitic capacitance designated by a reference numeral 16 inevitably exists between the anode of the photodiode 15 and the ground. The amplifier device 60 further comprises an amplifier 9 having first and second output terminals 9a and 9b which will be called non-inverting and inverting terminals, respectively, a comparator 18, and a switching transistor 10 which may be, for example, a field effect transistor (FET).

The anode of the photodiode 15 is connected to the input terminal of the amplifier 9 and the drain (D) of the switching transistor 10. The first output terminal 9a is connected to one of the input terminals of the comparator 18. Another one of the input terminals of the comparator 18 is connected to a threshold or reference voltage terminal 12 from which a first reference voltage is applied to the comparator 18. The output terminal of the comparator 18 is connected to the gate of the switching transistor 10. The source (S) of the switching transistor 10 is connected to the ground through a resistor 19. The second output terminal 9b of the amplifier 9 is connected to a device output terminal 35. Furthermore, the second output terminal 9b of the amplifier 9 is connected to the input terminal of the amplifier 9 through a resistor 32.

When the photodiode 15 receives a light signal, the photodiode 15 produces an electric current or signal in accordance with the light signal. The electric current is supplied to the amplifier 9 to be amplified into an amplified signal having an amplified voltage level. More particularly, the amplifier 9 produces a first amplified signal having the amplified voltage level from the first output terminal 9a. From the second output terminal 9b, the amplifier 9 produces a second amplified signal having an absolute level equal to the amplified voltage level.

Through the resistor 32, the second amplified signal is fed back to the input terminal of the amplifier 9 in order to carry out a transimpedance amplification. The transimpedance amplification is an amplification for converting a current into a voltage.

Now, it will be assumed that the gain of the amplifier 9 is given by Ag and that the resistance of the resistor 32 is given by R32. A transimpedance gain is given by:

$$\text{Transimpedance Gain} = \frac{Ag \cdot R32}{Ag + 1} \qquad (1)$$

The comparator 18 compares the amplified voltage level with the first reference voltage to produce a comparison result signal. More specifically, the comparator 18 produces the comparison result signal having a high level when the amplified voltage level is greater than the first reference voltage. When the amplified voltage level is greater than the first reference voltage, the switching transistor 10 becomes an on-state. As a result, the electric current outputted from the photodiode 15 partially passes to the ground through the resistor 19.

As readily understood from the above description, the comparator 18 makes the switching transistor 10 become the on-state in order to prevent the amplifier 9 from saturation when a large electric current is supplied from the photodiode 15 to the amplifier 9. Such a control may be called a protection control for a large input (current).

When the switching transistor 10 becomes the onstate, the transimpedance gain is given by:

$$\text{Transimpedance Gain} = \frac{Ag \cdot R32}{Ag + 1 + (R32/R19)}, \quad (2)$$

where R19 represents the resistance of the resistor 19.

It will be assumed that the amplifier 9 has an input offset voltage represented by ΔV. When the switching transistor 10 is an off-state, the amplifier 9 has a first output offset voltage given by:

$$\text{First Output Offset Voltage} = \frac{\Delta V \cdot Ag}{Ag + 1} \quad (3)$$

When the the FET 10 becomes the on-state, the amplifier 9 has a second output offset voltage given by:

Second Output Offset Voltage = (4)

$$\frac{\Delta V \cdot Ag \cdot (R32/R19)}{(R32/R19) + 1 + Ag} + \frac{\Delta V \cdot Ag}{(R32/R19) + 1 + Ag}$$

In case of Ag=30, R32=40 kΩ, R19=100Ω, and ΔV=10 mV, the first output offset voltage is equal to 9.7 mV. The second output offset voltage is equal to 279 mV.

As readily understood from the above description, the output offset voltage of the amplifier 9 non-linearly increases from the first output offset voltage to the second output offset voltage when the switching transistor 10 becomes the on-state.

Even when the amplified voltage is slightly greater than the reference voltage, the switching transistor 10 becomes the on-state. As a result, the transimpedance gain reduces as described above. When the transimpedance gain reduces, the amplified voltage becomes lower than the first reference voltage. When the amplified voltage becomes lower than the first reference voltage, the switching transistor 10 becomes the off-state. As a result, the transimpedance gain increases. Therefore, it is difficult to carry out a stable amplifying operation in the conventional amplifier device inasmuch as the transimpedance gain is often varied.

When the light signal is digital data in the form of burst, the electric current also has the burst data. As a result, the second amplified signal has a plurality of voltage levels during a burst period in accordance with the burst data. When the peak level of the voltage levels approaches the first reference voltage, the second amplified signal has the voltage levels under the first reference voltage and the voltage levels over the first reference voltage by an overshoot. As a result, the amplitude greatly varies between the burst data during the burst period.

Figure 2:
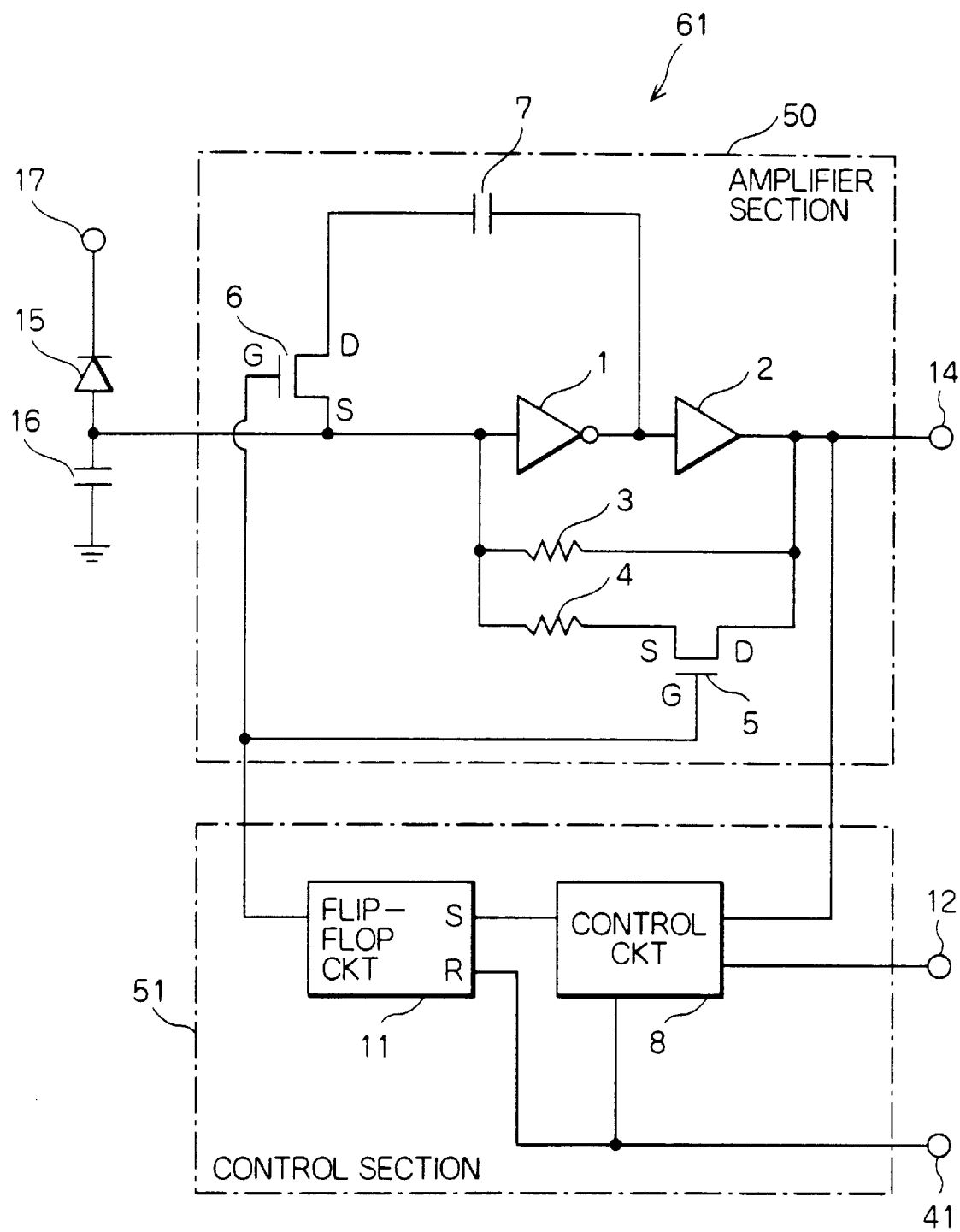
FIG. 2 is a block diagram of an amplifier device according to a preferred embodiment of this invention.

Referring to FIG. 2, description will proceed to an amplifier device according to a preferred embodiment of this invention. The illustrated amplifier device is different in structure from the amplifier device 60 illustrated in FIG. 1 and therefore designated afresh by a reference numeral 61. The amplifier device 61 comprises an amplifier section 50 and a control section 51. The amplifier device 61 comprises similar parts which are designated by like reference numerals and operable with likewise named signals.

The amplifier section 50 comprises an amplifier 1, a buffer circuit 2, and first and second switching transistors 5 and 6 each of which may be an PET. The control section 51 comprises a control circuit 8 and a flip-flop circuit 11.

The amplifier 1 is supplied with the electric current outputted from the photodiode 15. The amplifier 1 amplifies the electric current into an amplified signal having an amplified voltage level. The amplified signal is buffered by the buffer circuit 2 to be produced as a buffered signal which is equivalent to the amplified signal. The buffered signal is outputted as an amplified output signal from a device output terminal 14.

The output of the amplifier 1 is connected to the drain (D) of the second switching transistor 6 through a phase compensating capacitor 7. The source (S) of the second switching transistor 6 is connected to the input of the amplifier 1. The output of the buffer circuit 2 is connected to the input of the amplifier 1 through a resistor 3. Furthermore, the output of the buffer circuit 2 is connected to the drain (D) of the first switching transistor 5. The source (S) of the first switching transistor 5 is connected to the input of the amplifier 1 through a resistor 4.

The control circuit 8 is supplied with the buffered signal and the first reference voltage. The control circuit 8 produces a set signal in accordance with the amplified voltage level and the first reference voltage. The flip-flop circuit 11 is put into operation in response to the set signal to produce a control signal. The control signal is supplied to the gate (G) of the first switching transistor 5 and the gate (G) of the second switching transistor 6.

Responsive to the control signal, the first switching transistor 5 becomes an on-state. As a result, the resistor 4 is connected to the resistor 3 in parallel. Responsive to the control signal, the second switching transistor 6 becomes an on-state. As a result, the second switching transistor 6 makes the phase compensating capacitor be connected to the input of the amplifier 1.

The flip-flop circuit 11 may be supplied with a reset signal from a reset terminal 41. Supplied with the reset signal, the flip-flop circuit 11 is put out of operation to become a reset state. More particularly, the flip-flop circuit 11 makes the control signal be a low level. As a result, each of the first and the second transistors 5 and 6 becomes an off-state.

When each of the first and the second switching transistors 5 and 6 becomes the off-state, the transimpedance gain of the amplifier section 50 is given by:

$$\text{Transimpedance Gain} = \frac{Ag}{Ag + 1} \cdot R3, \quad (5)$$

where Ag represents the gain of the amplifier 1 and R3 represents the resistance of the resistor 3.

When each of the first and the second switching transistors 5 and 6 becomes the on-state, the transimpedance gain of the amplifier section 50 is given by:

$$\text{Transimpedance Gain} = \frac{Ag}{Ag + 1} \cdot \frac{R3 \cdot R4}{R3 + R4}, \quad (6)$$

where R4 represents the resistance of the resistor 4.

It will be assumed that the amplifier 1 has an input offset voltage represented by ΔV. Regardless of whether each of the first and the second switching transistors 5 and 6 becomes the on-state, the amplifier 1 has an output offset voltage given by:

$$\text{Output Offset Voltage} = \frac{\Delta V \cdot Ag}{Ag + 1}. \quad (7)$$

When each of the first and the second switching transistors 5 and 6 is the off-state, a cut-off frequency in a gain phase characteristic is given by:

$$\text{Cutoff Frequency} = \frac{Ag+1}{2\pi \cdot C16 \cdot R3}, \qquad (8)$$

where C16 represents the capacity of the parasitic capacitance 16.

When the first switching transistor 5 becomes the on-state, a feedback resistance is reduced inasmuch as the resistor 4 is connected to the resistor 3 in parallel. As a result, the cut-off frequency becomes high on the basis of the feedback resistance. At that time, the phase compensating capacitor 7 is connected to the input of the amplifier 1 inasmuch as the second switching transistor 6 becomes the on-state. When the second switching transistor 6 becomes the on-state, the electric capacity 16 is connected to the phase compensating capacitor 7 in parallel. Therefore, the cut-off frequency becomes low on the basis of the phase compensating capacitor 7.

Figure 3:
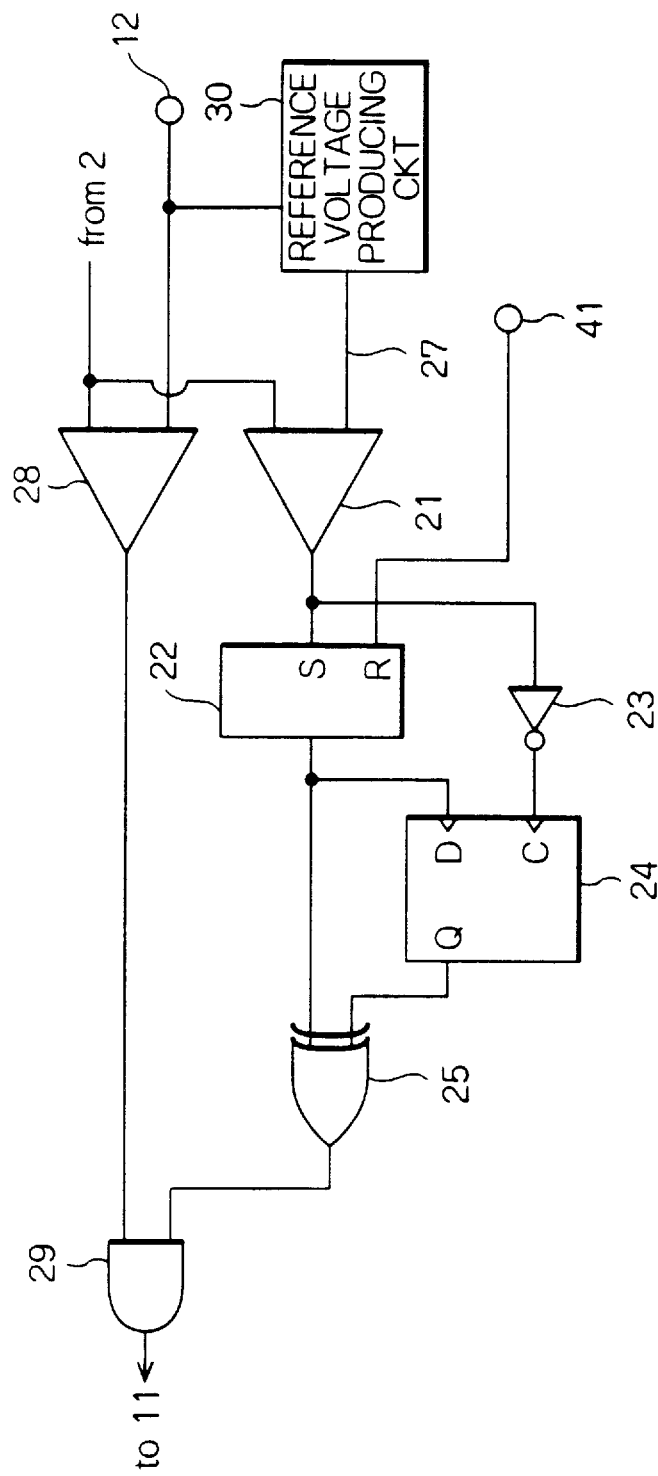
FIG. 3 is a block diagram of a first example of the control circuit illustrated in FIG. 2.

Referring to FIG. 3, description will proceed to a first example of the control circuit 8 illustrated in FIG. 2. As described above, the control circuit 8 is supplied with the buffered signal having the amplified voltage level. The control circuit 8 comprises a reference voltage producing circuit 30 for producing a second reference voltage less than the first reference voltage with reference to the first reference voltage. The control circuit 8 further comprises first and second comparators 28 and 21 each of which is supplied with the buffered signal. The first and the second comparators 28 and 21 are supplied with the first reference voltage and the second reference voltage, respectively.

Figure 4:
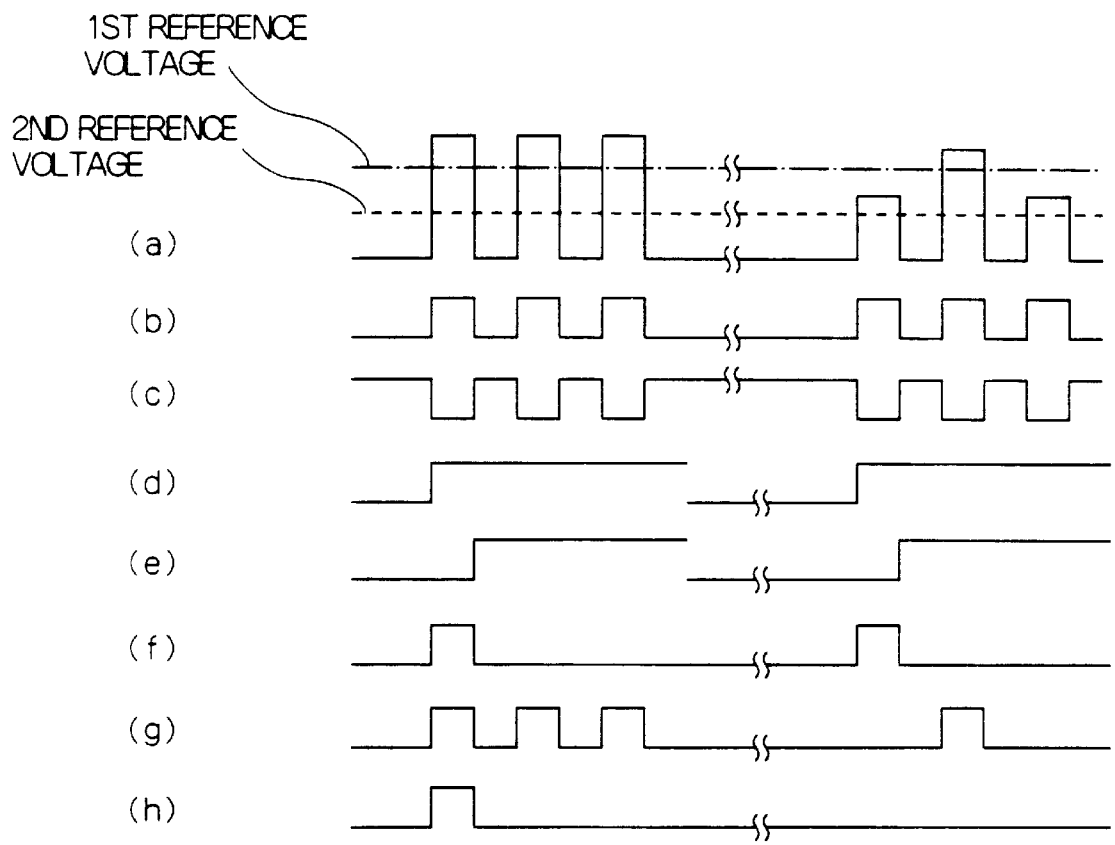
FIG. 4 is a timing chart for describing an operation of the control circuit illustrated in FIG. 3.

Referring to FIG. 4 in addition to FIG. 3, the buffered signal is a pulse signal having a plurality of pulses. Each of the pulses will be called the amplified voltage level. It is assumed that each of the pulses is greater than the first reference voltage and has a same level. The first comparator 28 produces a first comparison result signal as will be described later.

The second comparator 21 compares the buffered signal with the second reference voltage as shown in a first row labelled (a). When the buffered signal is greater than the second reference voltage, the second comparator 21 produces a second comparison result signal having a high level as shown in a second row labelled (b). The second comparison result signal is supplied to a terminal labelled "S" of a flip-flop 22. The flip-flop 22 may be supplied with the reset signal from the reset terminal 41. Responsive to the reset signal, the flip-flop circuit 22 is put out of operation to become a reset state.

The second comparison result signal is further supplied to a terminal labelled "C" of a delay flip-flop 24 through an inverter 23. More specifically, the second comparison result signal is inverted into an inverted signal by the inverter 23 as shown in a third row labelled (c). The inverted signal is supplied to the "C" terminal of the delay flip-flop 24.

Responsive to the second comparison result signal, the flip-flop 22 is put into operation to produce a flip-flop output signal of a high level as shown in a fourth row labelled (d). The flip-flop output signal is supplied to a terminal labelled "D" of the delay flip-flop 24 and an exclusive OR gate 25. Responsive to the inverted signal and the flip-flop output signal, the delay flip-flop 24 is put into operation to produce a delay flip-flop output signal of a high level as shown in a fifth row labelled (e). The delay flip-flop output signal is supplied to the exclusive OR gate 25.

The exclusive OR gate 25 carries out an exclusive OR between the flip-flop output signal and the delay flip-flop output signal to produce an EX output signal as shown in a sixth row labelled (f). The EX output signal is supplied to an AND gate 29.

On the other hand, the first comparator 28 compares the buffered signal with the first reference voltage as shown in the first row labelled (a). When the buffered signal is greater than the first reference voltage, the first comparator 28 produces the first comparison result signal having a high level as shown in a seventh row labelled (g). The first comparison result signal is supplied to the AND gate 29. Supplied with the EX output signal and the first comparison result signal, the AND gate 29 produces an AND'ed signal as the set signal as shown in an eighth row labelled (h). The set signal is supplied to the flip-flop circuit 11 as described above.

Now, it will be assumed that the buffered signal has some high levels less than the reference voltage as shown in the first row (a) of FIG. 4. More particularly, the buffered signal has first through third pluses. Each of the first and the third pulses has a level between the first reference voltage and the second reference voltage. The second pulse has a level greater than the reference voltage. In this case, the first comparator 28 produces the first comparison result signal at the timing of the second pulse of the buffered signal as shown in the seventh row (g) of FIG. 4. Inasmuch as each of the first through the third pulses has the level greater than the second reference voltage, the second comparator 21 produces the second comparison result signal at each timing of the first through the third pulses of the buffered signal as shown in the second row (b) of FIG. 4. The exclusive OR gate 25 produces the EX output signal at the timing of the first pulse of the buffered signal. Therefore, the AND gate 29 does not produce the control signal as shown in the eighth row (h) of FIG. 4.

As readily understood from the above description, each of the first and the second switching transistors 5 and 6 does not become the on-state when the buffered signal has the second pulse between the first pulse and the third pulse. Therefore, the amplifier device is capable of carrying out a stable amplifying operation inasmuch as variation is a little in the transimpedance gain.

Figure 5:
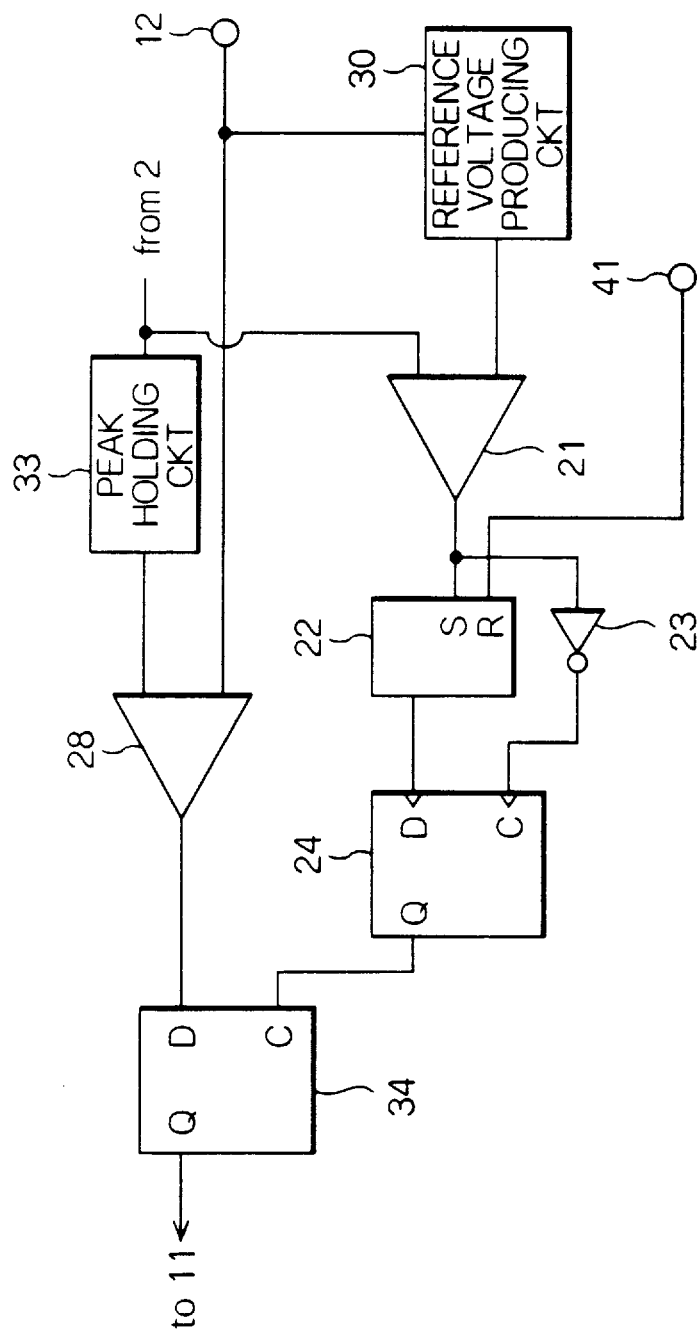
FIG. 5 is a block diagram of a second example of the control circuit illustrated in FIG. 2.

Referring to FIG. 5, description will proceed to a second example of the control circuit illustrated in FIG. 2. The control circuit 8 illustrated in FIG. 5 is different in structure from the control circuit 8 illustrated in FIG. 3. The control circuit 8 comprises similar parts which are designated by like reference numerals and operable with likewise named signals. The control circuit 8 further comprises a peak holding circuit 33 and an additional delay flip-flop circuit 34.

Figure 6:
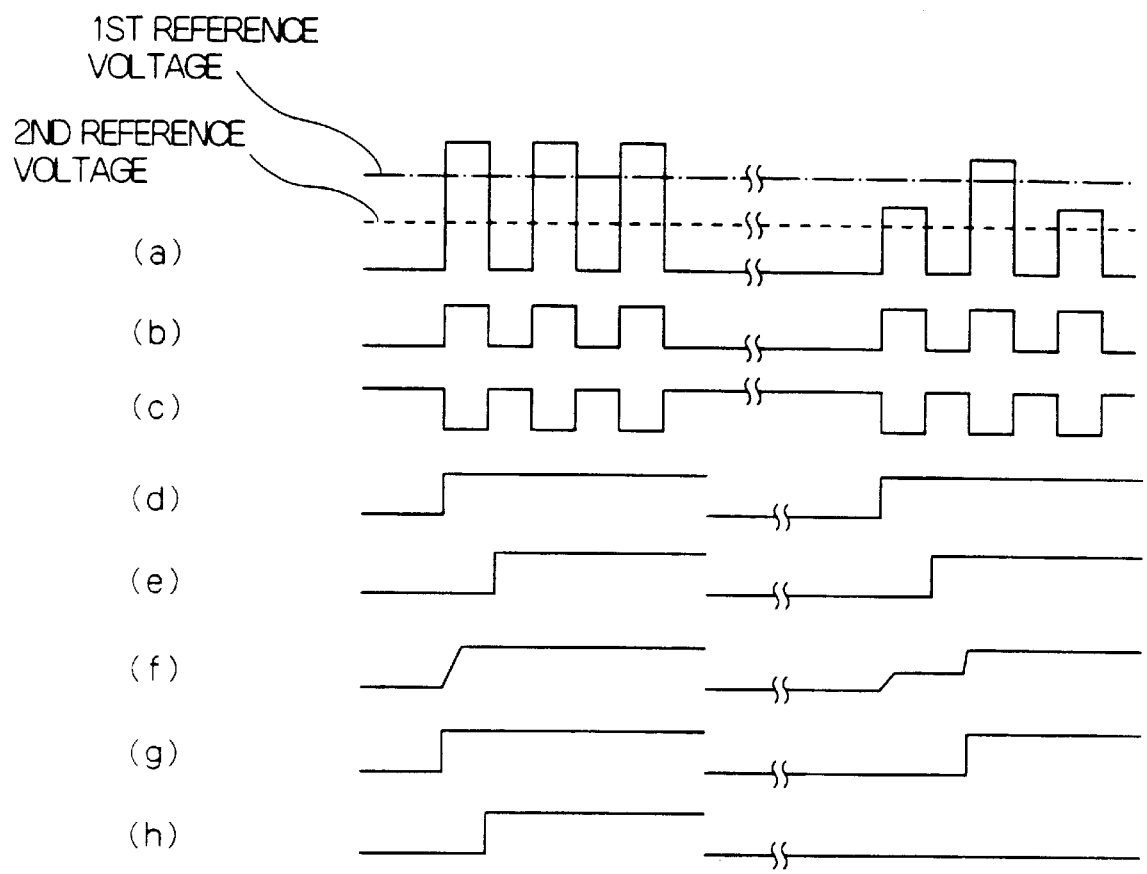
FIG. 6 is a timing chart for describing an operation of the control circuit illustrated in FIG. 5.

Referring to FIG. 6 in addition to FIG. 5, the buffered signal is the pulse signal having a plurality of pulses as described in conjunction with FIG. 3. It will be assumed that each of pulses is greater than the first reference voltage and has a same level. The second comparator 21 is supplied with the buffered signal shown in a first row labelled (a) of FIG. 6. The second comparator 21 compares the buffered signal with the second reference voltage to produce the second comparison result signal as shown in a second row labelled (b) of FIG. 6. By the inverter 23, the second comparison result signal is inverted into the inverted signal shown in a third row labelled (c) of FIG. 6. Responsive to the second comparison result signal, the flip-flop circuit 22 produces the flip-flop output signal shown in a fourth row labelled (d) of FIG. 6. Responsive to the flip-flop output signal and the inverted signal, the delay flip-flop circuit 24 produces the delay flip-flop output signal shown in a fifth row labelled (e) of FIG. 6. The delay flip-flop output signal is supplied to a terminal labelled "C" of the additional delay flip-flop circuit 34.

The buffered signal is supplied to the peak holding circuit 33. The peak holding circuit 33 holds a peak level of the buffered signal to produce a peak signal representative of the peak level as shown in a sixth row labelled (f) of FIG. 6. The peak signal is supplied to the first comparator 28. The first comparator 28 compares the peak signal with the first reference voltage. When the peak level is greater than the first reference voltage, the first comparator 28 produces the first comparison result signal shown in a seventh row labelled (g) of FIG. 6. The first comparison result signal is supplied to a terminal labelled "D" of the additional delay flip-flop circuit 34. Supplied with the delay flip-flop output signal and the first comparison result signal, the additional delay flip-flop circuit 34 is put into operation to produce an additional delay flip-flop output signal shown in an eighth row labelled (h) of FIG. 6. The additional delay flip-flop output signal is supplied to the flip-flop 11 (FIG. 2) as the set signal.

Now, it will be assumed that the buffered signal has a plurality of pulses of which levels may be different from one another. In the example being illustrated, the buffer signal has first through third pulses. Each of the first and the third pulses has a level between the first reference voltage and the second reference voltage. The second pulse has a level greater than the first reference voltage. In this case, the peak holding circuit 33 at first holds a peak level of the first pulse as a first peak level to produce the peak signal having the first peak level at the timing of the first pulse. Furthermore, the peak holding circuit 33 holds a peak level of the second pulse as a second peak level to produce the peak signal having the second peak level at the timing of the second pulse.

Inasmuch as the first peak level is less than the first reference voltage and the second peak level is greater than the first reference voltage, the first comparator 28 produces the first comparison result signal when the level of the peak signal changes from the first peak level to the second peak level. When the first comparison result signal changes from the low level to the high level, the delay flip-flop output signal changes from the low level to the high level. Therefore, the additional delay flip-flop circuit 34 does not produce the set signal.

As readily understood from the above description, each of the first and the second switching transistors 5 and 6 does not become the on-state when the buffered signal has the second pulse between the first pulse and the third pulse. Therefore, the amplifier device is capable of carrying a stable amplifying operation inasmuch as variation is a little in the transimpedance gain.

Figure 7:
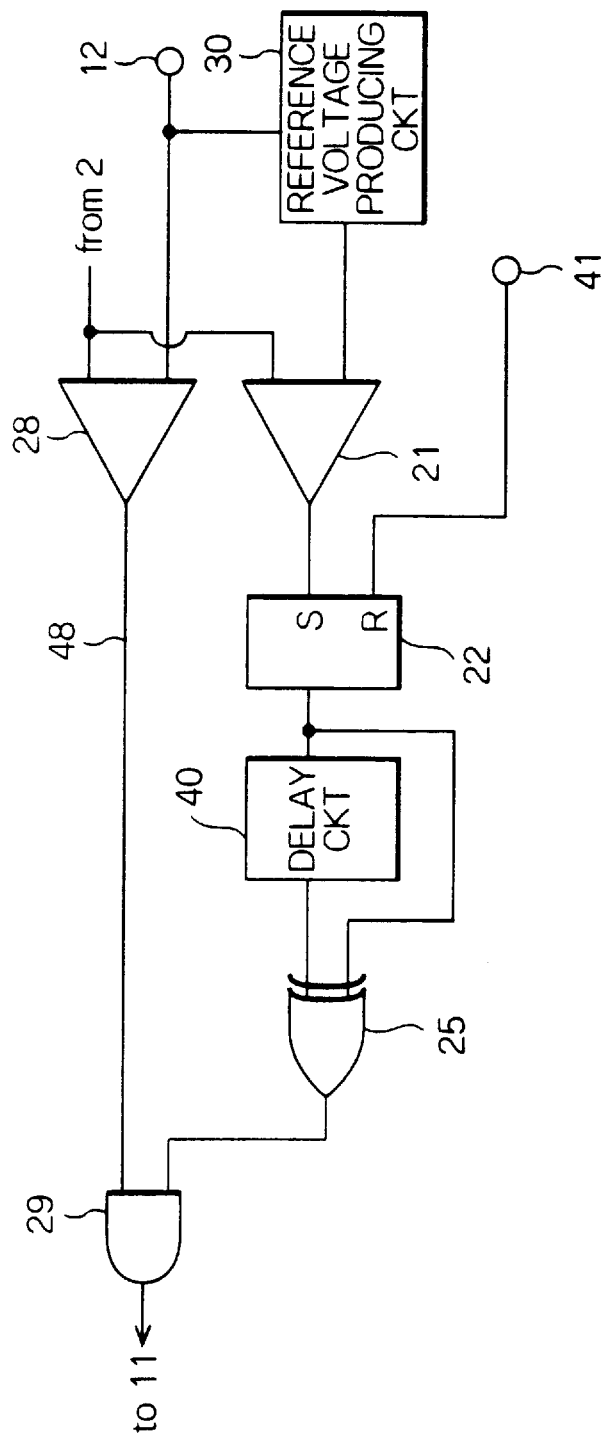
FIG. 7 is a block diagram of a third example of the control circuit illustrated in FIG. 2.

Referring to FIG. 7, description will proceed to a third example of the control circuit illustrated in FIG. 3. The control circuit 8 illustrated in FIG. 7 is different in structure from the control circuit 8 illustrated in FIG. 3. The control circuit 8 comprises similar parts which are designated by like reference numerals and operable with likewise named signals. The control circuit 8 comprises a delay circuit 40 instead of the delay flip-flop circuit 24 illustrated in FIG. 3.

Figure 8:
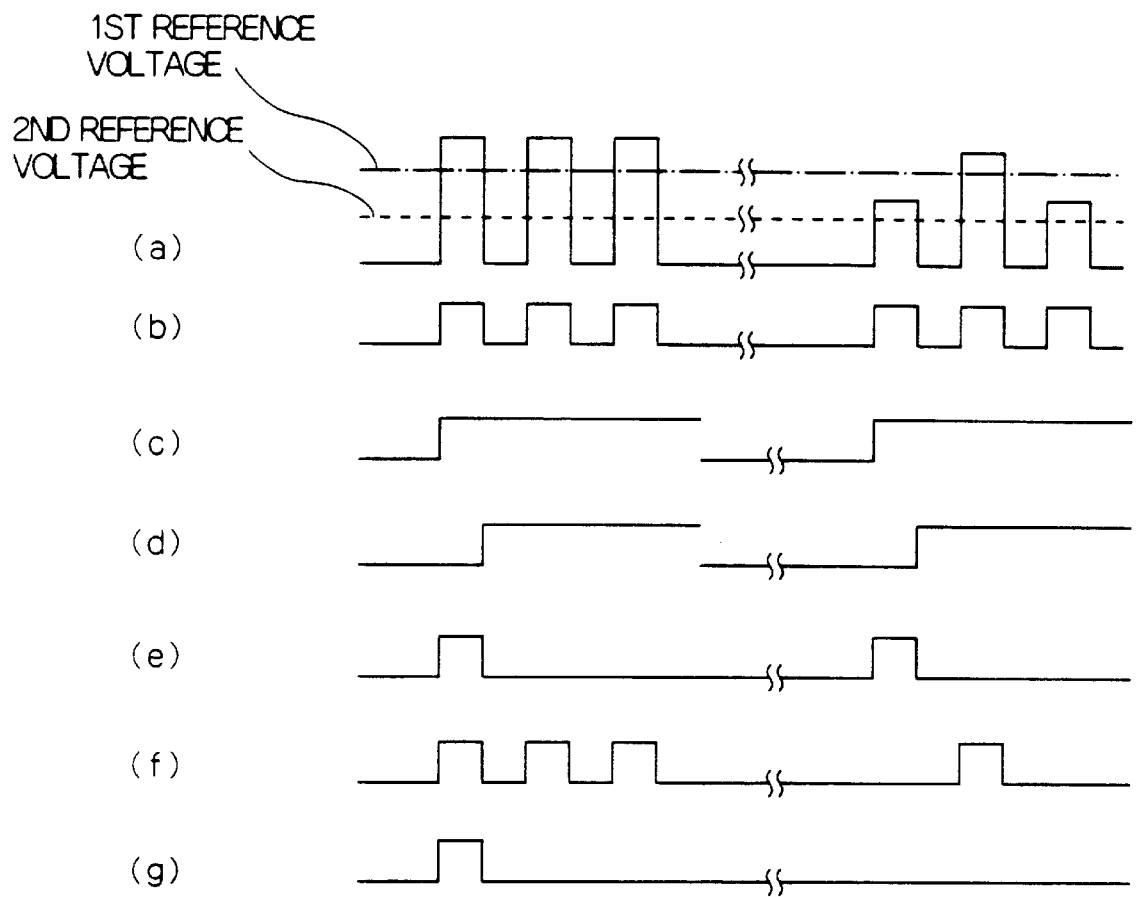
FIG. 8 is a timing chart for describing an operation of the control circuit illustrated in FIG. 7.

Referring to FIG. 8 in addition to FIG. 7, the buffered signal is the pulse signal having a plurality of pulses as described in conjunction with FIG. 3. It will be assumed that each of pluses is greater than the reference voltage and has a same level. The second comparator 21 is supplied with the buffered signal shown in a first row labelled (a) of FIG. 8. The second comparator 21 compares the buffered signal with the second reference voltage to produce the second comparison result signal as shown in a second row labelled (b) of FIG. 8. Responsive to the second comparison result signal, the flip-flop circuit 22 produces the flip-flop output signal shown in a third row labelled (c) of FIG. 8. The flip-flop output signal is supplied to the delay circuit and the exclusive OR gate 25.

The delay circuit 40 gives a delay to the flip-flop output signal to produce a delayed signal shown in a fourth row labelled (d) of FIG. 8. The delayed signal is supplied to the exclusive OR gate 25. The exclusive OR gate 25 carries out an exclusive OR between the flip-flop output signal and the delayed signal to produce EX output signal shown in a fifth row labelled (e) of FIG. 8. The EX output signal is delivered to the AND gate 29.

The buffered signal is supplied to the first comparator 28. The first comparator 28 compares the buffered signal with the first reference voltage. When the buffered signal is greater than the first reference voltage, the first comparator 28 produces the first comparison result signal shown in a sixth row labelled (f) of FIG. 8. The first comparison result signal is supplied to the AND gate 29. Supplied with the EX output signal and the first comparison result signal, the AND gate produces the AND'ed signal as the set signal shown in a seventh row labelled (g) of FIG. 8.

Now, it will be assumed that the buffered signal has a plurality of pulses of which levels may be different from one another. In the example being illustrated, the buffer signal has first through third pulses. Each of the first and the third pulses has a level between the first reference voltage and the second reference voltage. The second pulse has a level greater than the first reference voltage. In this case, the first comparator 28 produces the first comparison result signal at the timing of the second pulse of the buffered signal as shown in the sixth row (f) of FIG. 8. Inasmuch as each of the first through the third pulses has the level greater than the second reference voltage, the second comparator produces the second comparison result signal at each timing of the first through the third pulses of the buffered signal. The exclusive OR gate 25 produces the EX output signal at the timing of the first pulse of the buffered signal as shown in the fifth row (e) of FIG. 8. Therefore, the AND gate does not produce the control signal as shown in the seventh row (g) of FIG. 8.

As readily understood from the above description, each of the first and the second switching transistors 5 and 6 does not become the on-state when the buffered signal has the second pulse between the first pulse and the third pulse. Therefore, the amplifier device is capable of carrying a stable amplifying operation inasmuch as variation is a little in the transimpedance gain.

What is claimed is:

1. An amplifier device comprising a light-sensitive detector for detecting a light signal to produce an electric signal in accordance with said light signal and an amplifier section for amplifying said electric signal into an amplified electric signal having an amplified level, wherein said amplifier section comprises:

amplifying means having a variable gain which is varied in accordance with a control signal, said amplifying means amplifying said electric signal into said amplified electric signal in accordance with said control signal; and producing means for producing said control signal on the basis of said amplified electric signal and a first reference level, wherein said control signal producing means comprises:

set signal producing means for producing a set signal in accordance with said amplified electric signal and said first reference level; and first flip-flop means being put into operation in response to said set signal for producing said control signal, wherein said set signal producing means comprises:

first comparator means for comparing said amplified electric signal with said first reference level to produce a first comparison result signal when said amplified level is greater than said first reference level;

second comparator means for comparing said amplified electric signal with a second reference level less than said first reference level, said second comparator means producing a second comparison result signal when said amplified electric level is greater than said second reference level;

second flip-flop means being put into operation in response to said second comparison result signal for producing a first output signal; and supplying means for supplying said set signal to said first flip-flop means in accordance with said first output signal and said first comparison result signal.

2. An amplifier device as claimed in claim 1, wherein said amplifying means comprises:

amplifier means having input and output terminals for amplifying said electric signal into said amplified electric signal;

resistor means for connecting said output terminal to said input terminal, said resistor means having a variable resistance which is varied in accordance with said control signal; and capacitor means having a capacitance for selectively connecting said output terminal to said input terminal in response to said control signal.

3. An amplifier device as claimed in claim 2, wherein said resistor means comprises:

a first resistor connecting said input terminal to said output terminal;

a second resistor; and first switching means responsive to said control signal for connecting said second resistor to said first resistor in parallel.

4. An amplifier device as claimed in claim 3, wherein said first switching means comprises a field effect transistor.

5. An amplifier device as claimed in any one of claims 2 to 4, wherein said capacitor means comprises:

a capacitor having said capacitance; and second switching means responsive to said control signal for connecting said output terminal to said input terminal by said capacitor.

6. An amplifier device as claimed in claim 5, wherein said second switching means comprises a field effect transistor.

7. An amplifier device as claimed in claim 1, wherein said second flip-flop means comprises:

a flip-flop circuit being put into operation in response to said second comparison result signal for producing a flip-flop output signal;

an inverter circuit for inverting said second comparison result signal into an inverted signal;

a delay flip-flop circuit for holding said flip-flop output signal in accordance with said inverted signal to produce a delay flip-flop output signal; and an exclusive OR circuit for carrying out an exclusive OR between said flip-flop output signal and said delay flip-flop output signal to produce an exclusive OR signal as said first output signal.

8. An amplifier device as claimed in claim 7, wherein said supplying means comprises an AND gate for carrying out a logical multiplication between said first output signal and said first comparison result signal to produce said set signal.

9. An amplifier device comprising a light-sensitive detector for detecting a light signal to produce an electric signal in accordance with said light signal and an amplifier section for amplifying said electric signal into an amplified electric signal having an amplified level, wherein said amplifier section comprises:

amplifying means having a variable gain which is varied in accordance with a control signal, said amplifying means amplifying said electric signal into said amplified electric signal in accordance with said control signal; and producing means for producing said control signal on the basis of said amplified electric signal and a first reference level, wherein said control signal producing means comprises:

set signal producing means for producing a set signal in accordance with said amplified electric signal and said first reference level; and first flip-flop means being put into operation in response to said set signal for producing said control signal, wherein said set signal producing means comprises:

peak holding means for holding said amplified electric signal to produce a peak signal having a peak level;

first comparator means for comparing said peak signal with said first reference level to produce a first comparison result signal when said peak level is greater than said first reference level;

second comparator means for comparing said amplified electric signal with a second reference level less than said first reference level, said second comparator means producing a second comparison result signal when said amplified level is greater than said second reference level;

a second flip-flop circuit being put into operation in response to said second comparison result signal for producing a flip-flop output signal;

an inverter circuit for inverting said second comparison result signal into an inverted signal;

a first delay flip-flop circuit for holding said flip-flop output signal in accordance with said inverted signal to produce a first delay flip-flop output signal; and a second delay flip-flop circuit for holding said first comparison signal in accordance with said first delay flip-flop output signal to produce said set signal.

10. An amplifier device comprising a light-sensitive detector for detecting a light signal to produce an electric signal in accordance with said light signal and an amplifier section for amplifying said electric signal into an amplified electric signal having an amplified level, wherein said amplifier section comprises:

amplifying means having a variable gain which is varied in accordance with a control signal, said amplifying means amplifying said electric signal into said amplified electric signal in accordance with said control signal; and producing means for producing said control signal on the basis of said amplified electric signal and a first reference level, wherein said control signal producing means comprises:

set signal producing means for producing a set signal in accordance with said amplified electric signal and said first reference level; and first flip-flop means being put into operation in response to said set signal for producing said control signal, wherein said set signal producing means comprises:

first comparator means for comparing said amplified electric signal with said first reference level to produce a first comparison result signal when said amplified level is greater than said first reference level;

second comparator means for comparing said amplified electric signal with a second reference level, said second comparator means producing a second comparison result signal when said amplified level is greater than said second reference level;

second flip-flop means being put into operation in response to said second comparison result signal for producing a flip-flop output signal;

a delay circuit for giving a delay to said flip-flop output signal to produce a delayer signal;

an exclusive OR circuit for carrying out an exclusive OR between said flip-flop output signal and said delayed signal to produce an exclusive OR signal; and an AND gate for carrying out a logical multiplication between said exclusive OR signal and said first comparison result signal to produce said set signal.

* * * * *